United States Patent [19]

Abraham et al.

[11] Patent Number: 4,572,618

[45] Date of Patent: Feb. 25, 1986

[54] METHOD FOR THE PREPARATION OF PHOTOCHROMIC INSULATING CRYSTALS

[75] Inventors: Marvin M. Abraham, Oak Ridge, Tenn.; Jose L. Boldu, Mexico City, Mexico; Yok Chen, Oak Ridge, Tenn.; Victor M. Orera, Zaragosa, Spain

[73] Assignee: The United States of America as represented by the Department of Energy, Washington, D.C.

[21] Appl. No.: 655,592

[22] Filed: Sep. 28, 1984

[51] Int. Cl.[4] .......................... G02B 5/23; C04B 35/00
[52] U.S. Cl. ........................................ 350/354; 501/1; 501/13; 501/86; 156/605; 156/DIG. 78; 423/265; 423/275
[58] Field of Search ............... 501/13, 1, 86; 423/265, 423/275; 156/602, 605, 621, DIG. 78; 350/354

[56] References Cited

U.S. PATENT DOCUMENTS 4,376,755  3/1983  Narayan et al. .................. 501/86 X

OTHER PUBLICATIONS

"Photochromic Effect in Magnesium Oxide Containing Lithium and Nickel Impurities," Mondragon et al., *J. Appl. Physics*, 57(2), 509–11.

*Primary Examiner*—William R. Dixon, Jr.
*Assistant Examiner*—Karl Group
*Attorney, Agent, or Firm*—Stephen D. Hamel; Judson R. Hightower

[57] ABSTRACT

A method for preparing reversible-photochromic magnesium oxide (MgO) crystals. Single crystals of MgO doped with both lithium (Li) and nickel (Ni) are grown by a conventional arc fusion method. The as-grown crystals are characterized by an amber coloration. The crystals lose the amber coloration and become photochromic when they are thermochemically reduced by heating at temperatures greater than 1000° K. in a hydrogen atmosphere. Alternate irradiation with UV and visible light result in rejuvenation and bleaching of the amber coloration, respectively.

11 Claims, 5 Drawing Figures

METHOD FOR THE PREPARATION OF PHOTOCHROMIC INSULATING CRYSTALS

BACKGROUND OF THE INVENTION

Field of the Invention and Contract Statement

The present invention relates to photochromic crystals of MgO and to a process for the preparation of such crystals. The United States Government has rights in this invention pursuant to Contract No. W-7405-ENG-26 between the U.S. Department of Energy and Union Carbide Corporation, Nuclear Division.

DISCUSSION OF BACKGROUND AND PRIOR ART

Materials that exhibit reversible changes in color in response to different wavelengths of a beam of illuminating light, known as photochromic materials, have many applications such as optical systems for storage of information, optical filters, reversible photographic devices and light-operated switching and controlling devices. There is a continuing interest in ionic crystals for such purposes.

In ionic crystals, the photochromic effect involves a photoinduced charge transfer between ions and/or defects. A number of host materials exhibit such property [Akishige, Y., and K. Ohi, "Identification Of Photochromic Absorption in $KTaO_3$ Doped With Ni And Fe," Jap. Journ. Appl. Phys. 19, 9, (Sept. 1980), 1633-1639], such as, strontium titanate ($SrTiO_3$) containing (doped with) ions of a transition metal, as an impurity, [Koidl, P., K. W. Blazey, W. Berlinger and K. Am Muller, "Photochromism In Ni-Doped $SrTiO_3$," Phys. Rev. Vol. 14, No. 7, (Oct. 1976), 2703-2708], and calcium fluoride ($CaF_2$) doped with ions of a rare earth as an impurity, [Staebler, D.L., and S. E. Schnatterly, "Optical Studies Of A Photochromic Color Center In Rare-Earth-Doped $CaF_2$," Phys. Rev. Vol. 3, No. 2, (Jan. 1971), 516-526]. A number of oxide crystals, with impurities added, have been investigated for photochromic characteristics, particularly magnesium oxide (MgO) which was found to display no photochromic properties when doped with any one of the following impurities: iron, chromium, copper, nickel, vanadium and manganese. [Abraham, M. M., C. T. Butler, anc Y. Chen. "Growth Of High-Purity And Doped Alkaline Earth Oxides: I. MgO and CaO", J. Chem. Phys. 55, 3752 (1971); Chen, Y., M. M. Abraham, L. C. Templeton, and W. P. Unruh, "Role Of Hydrogen And Deuterium On The $V^-$-Center Formation In MgO", Phys. Rev. B 11, 881 (1975); Rubio 0. J., Y. Chen, and M. M. Abraham, "Tetravalent Manganese In Lithium-Doped MgO And CaO", J. Chem. Phys. 64, 4804 (1976); Boldu, J. L., E. Munoz, K. L. Tang, M. M. Abraham, and Y. Chen. "The Effect of Ionizing Radiation On Nickel-Doped MgO", (to be published); and Lacy, J. B., M. M. Abraham, J. L. Boldu, Y. Chen, J. Narayan, and H. T. Tohver, "Oxidation And Reduction Of Lithium-Containing MgO At High Temperatures", Phys. Rev. B 18. 4136, (1978)]

SUMMARY OF THE INVENTION

An object of the invention is to provide photochromic crystals of MgO. Another object of the invention is to provide a process for the preparation of photochromic MgO crystals. Other objects and advantages of the invention are set out herein or are obvious herefrom to one ordinarily skilled in the art.

The objects and advantages of this invention are achieved by the improved detection system of the invention.

To achieve the foregoing and other objects and in accordance with the purpose of the invention, as embodied and broadly described herein the invention, photochromic magnesium oxide crystals containing about 0.1 to about 0.01 weight percent, based on the amount of magnesium oxide, of lithium and about 0.05 to about 0.0005 weight percent, based on the amount of magnesium oxide, of nickel is provided. Preferably photochromic magnesium oxide crystals contain about 0.04 weight percent, based on the amount of magnesium oxide of lithium and about 0.005 weight percent based on the amount of magnesium oxide, of nickel. The magnesium oxide crystals can be changed from a substantially colorless state to an amber color by exposing the photochromic magnesium oxide crystals to ultraviolet light. Also, the photochromic magnesium oxide crystals can be changed from an amber color to a substantially colorless state by exposing the photochromic magnesium oxide crystals to visible light.

The invention also involves the process of producing a photochromic magnesium oxide crystal containing about 0.1 to about 0.01 weight percent, based on the amount of magnesium oxide, of lithium and about 0.05 to about 0.0005 weight percent, based on the amount of magnesium oxide, of nickel. The process includes mixing (i) magnesium oxide powder, (ii) about 10 to about 1 weight percent, based on the amount of magnesium oxide powder, of lithium carbonate powder and (iii) about 0.1 to about 0.003 weight percent, based on the amount of magnesium oxide powder, of nickel oxide powder. A crystal is grown from the powder mixture using the arc fusion procedure. The crystal is then thermochemically reduced in hydrogen atmosphere at a temperature of 1000° to 2200° K. The photochromic magnesium oxide containing lithium and nickel, which is substantially colorless, is thereby obtained. 10 Preferably about 5 weight percent, based on the amount of magnesium oxide powder, of lithium carbonate and about 0.01 weight percent, based on the amount of magnesium oxide powder, of nickel oxide powder are used.

The invention lies in the discovery that a MgO crystal, when doubly doped with lithium (Li) and nickel (Ni) and subsequently thermochemically reduced, becomes predictably photochromic. The method for preparing these crystals preferably comprises the general steps of (1) adding about 5 percent of $Li_2CO_3$ powder and about 0.01 weight percent of NiO powders by weight to MgO powder, (2) growing a single crystal of the thoroughly mixed material by a conventional arc fusion procedure, and (3) thermochemically reducing the single crystal in a reducing (hydrogen) atmosphere at 1000° to 2200° K. Crystals thus-prepared are substantially colorless; however, they change to an amber color on exposure to a beam of ultraviolet (UV) light. A subsequent irradiation with visible light results in the loss of the amber color by the crystals.

The invention photochromic MgO crystals are useful in commercially-produced or other optical systems, such as, systems for information storage, optical filters, reversible photographic devices, holograms and light-operated switching and controlling systems.

Reference will now be made in detail to the present preferred embodiment of the invention, an example of which is illustrated in the accompanying drawings.

BRIEF DESCRIPTION OF THE DRAWINGS

The accompanying drawings, which are incorporated in and form a part of the specification, illustrate the invention and, together with the description serve to explain the principles of the invention. In the drawings.

DETAILED DESCRIPTION OF THE INVENTION

Figure 1:
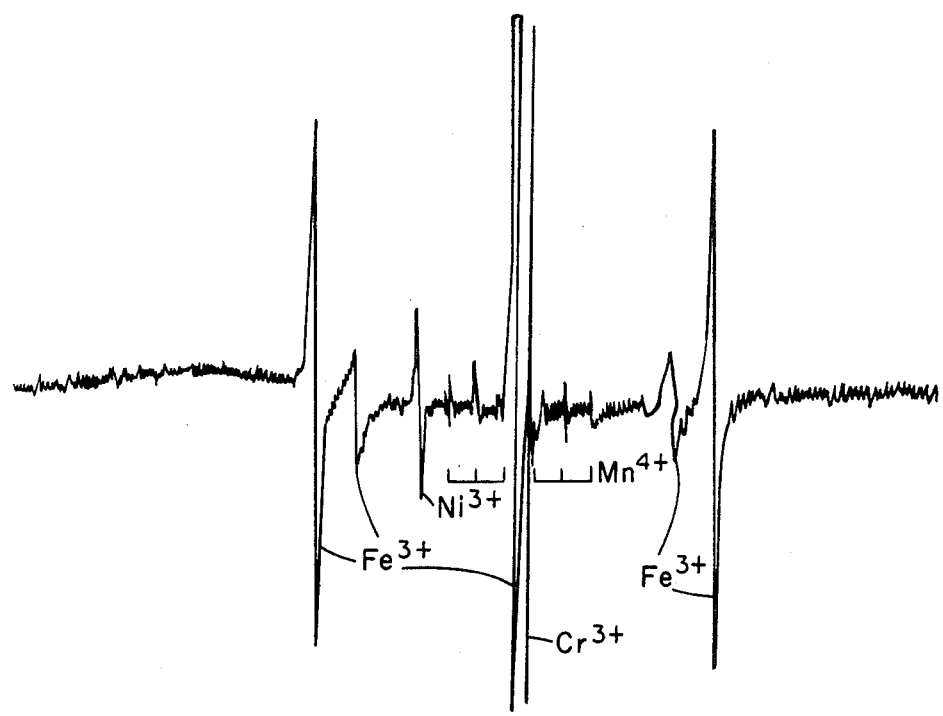
FIG. 1 is an EPR spectrum of an as-grown MgO crystal doped with lithium and nickel impurities, of the invention.

All parts, percentages ratios and proportions are on a weight basis unless otherwise stated herein or obvious herefrom to one ordinarily skilled in the art.

A description of the method and the photochromic MgO crystals produced thereby is given in detail below.

Single crystals were grown by the arc fusion method employing a mixture of 5 percent of $Li_2CO_3$ and 0.01 percent of NiO by weight in MgO powder obtained from the Kanto Chemical Company of Tokyo, Japan. [The inherent impurities in the crystals grown from Kanto powders are typically: Al (10 ppm), Ca (40 ppm), Fe (5 ppm), Si (15 ppm) and P (10 ppm); Mn, V and Cr are almost always present, but are generally present at a level of less than or equal to 1 ppm.] The actual concentrations of lithium and nickel in the resulting crystals were determined by spectrographic analyses to be approximately 0.04 and 0.005 percent, respectively. The concentrations of Li and Ni used in these tests were arbitrarily chosen, and the photochromic effect can be produced with other concentrations. A characteristic amber color was observed in the resultant crystals.

While any version of the carbon arc-fusion technique can be used, the variation disclosed in Abraham, M. M., C. T. Butler and Y. Chen, "Growth of High-Purity and Doped Alakaline Earth Oxide: I. MgO and CaO", The Journal Of Chemical Physics, Vol. 55, No. 8, (13 October 1971), pp. 3752 to 3756, was used. The crystal growth apparatus, similar to that used by W. & C. Spicer Ltd., Winchcomb, Glous., England, comprises a water-cooled stainless-steel tub with a hollow depression in the form of an inverted tetrahedron with chamfered edges and a truncated bottom. Parallel to the three chamfered edges of this depression are inserted graphite electrode assemblies. Graphite electrodes are made of high-purity graphite obtained from Ultracarbon, Bay City, Michigan. Power for the arc is controlled by a three-phase saturable reactor. In actual operation of the furnace, a fourth electrically inactive graphite rod, serving as a bridging electrode, provides a convenient means of insuring good initial contact between adjacent electrodes at the start of the run. Moreover, when it is later withdrawn, it leaves a vent through which gases may escape. The starting materials were high-purity grade MgO powder from Kanto Chemical Company, Tokyo, Japan. Although powders isostatically compacted to a bulk density of 1.2 g/cm$^3$ have been used for MgO, an even greater bulk density was obtained here by using sintered material from a prerun. This latter procedure actually saves time and lowers the cost. The bulk density of the starting material greatly affects the size of the crystals obtained.

Growth of the MgO was carried out for about 70 min. at arc powers of about 50 and 40 kW, respectively, thereby forming an aggregate of large single crystals beneath the arc. The powder was then lowered and maintained at 20 and 10 kW, respectively, for long periods (about 10 hours) or until the electrodes were expended.

For growth of crystals doped with Li and Ni impurities, one can localize the mixture of host powder and impurities within a confined region. The furnace was packed with relatively cheap MgO powder and a short (20–30 min.) crystal growth run at low power made. This step was necessary for containment of the later dopant mixtures while the short duration assured a small cavity. The result was a small group of crystals located at the bottom of a glassy-walled cavity. A portion of the roof of the cavity was carefully removed and the crystals harvested. The cavity was repacked with a mixture of the starting material and the dopant. During another short run, the doped crystals were formed at the bottom of a second cavity entirely contained within the protective walls of the first.

The Abraham et al. variation of the carbon arc-fused technique allows the growth of large MgO crystals, having Li and Ni dopants, free of microbubbles.

The as-grown crystals were monitored by electron paramagnetic resonance (EPR) in an X-band Varian VA-4500. The system was equipped with a low temperature device that allowed studies at liquid nitrogen temperatures. Table I shows the absolute concentration of several paramagnetic impurities in an as-grown sample as monitored by EPR:

TABLE I

| Impurity | Measured concentration (ions/cm$^3$) |
|---|---|
| $Fe^{3+}$ (cubic sites) | $5.8 \times 10^{16}$ |
| $Ni^{3+}$ (cubic sites) | $1.5 \times 10^{15}$ |
| $Cr^{3+}$ (cubic sites) | $1.3 \times 10^{15}$ |
| $Mn^{4+}$ (cubic sites) | $1.3 \times 10^{15}$ |
| $Mn^{4+}$ (axial sites) | $2.0 \times 10^{15}$ |

The absolute concentration of the various impurities in the samples was determined by comparing the resonance line of the impurity to that of a phosphorus doped silicon standard. It is believed that the values reported in Table I are accurate to +25 percent.

FIG. 1 shows a typical EPR spectrum of MgO:Li,Ni in the as-grown state. The spectral lines are identified as $Ni^{3+}$, $Fe^{3+}$, $Mn^{4+}$ and $Cr^{3+}$, all in cubic-symmetry sites. The spectrum was taken with H parallel to a crystal <100> axis at T=77° K.

Figure 2:
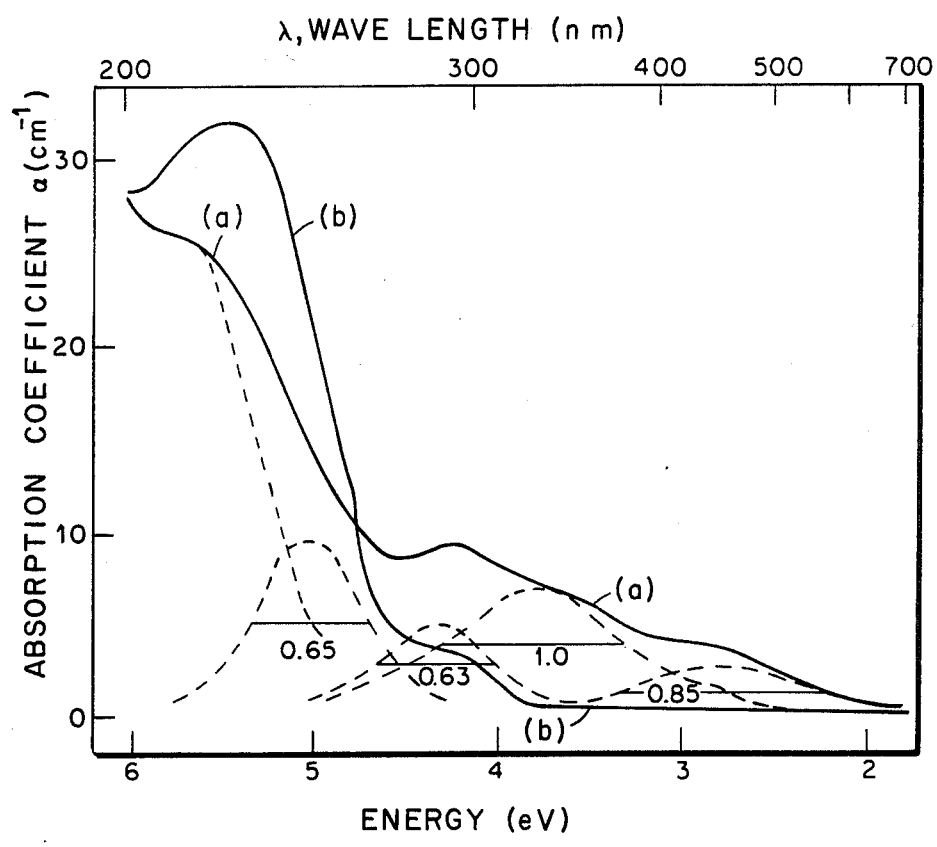
FIG. 2 is an optical absorption spectrum of (a) an as-grown MgO crystal co-doped with lithium and nickel impurities, of the invention (the dashed lines representing the computer deconvolution into gaussian curves), and (b) the same invention crystal after thermochemical reduction in hydrogen.

The spectrum consists of signals of several paramagnetic impurities, namely, $Fe^{3+}$ in cubic sites, $Cr^{3+}$ in cubic sites, $Mn^{4+}$ in cubic and axial sites and an isotropic line with g=2.1685 ±0.0005. This signal is attributed to $Ni^{3+}$ ions. See Table I. The optical absorption spectrum of an as-grown crystal, performed at room temperature with either a Perkin-Hitachi or Cary 17-D spectrophotometer, is presented as curve 2a in FIG. 2. Five absorption bands (dashed curves) can be deciphered with the aid of a computer program. The bands at 4.3 and 5.7 eV have previously been identified as being due to $Fe^{3+}$ ions. The other three bands, with peaks at 2.6, 3.8 and 5.0 eV, were previously attributed to $Ni^{3+}$ ions.

The thermochemical reduction was done as follows: A furnace with a 3.2 cm internal diameter quartz tube inserted in a horizontal axial hole was used for heating the samples. The samples can be heated in static air (no air flowing), flowing oxygen or flowing hydrogen atmospheres. When samples were to be heated in flowing hydrogen (99.999 percent pure), special care was taken to eliminate oxygen from the quartz tube by first passing nitrogen through it. The crystals were heated in a given atmosphere for 10 minutes at each of several different temperatures. Following each 10 minute period, the samples were pulled quickly out of the furnace portion of the tube to the room temperature portion of the tube (still in their respective atmospheres). The process of heating the sample followed by pulling the sample out quickly constituted the freezing in of defects generated by the heat treatment.

Figure 3:
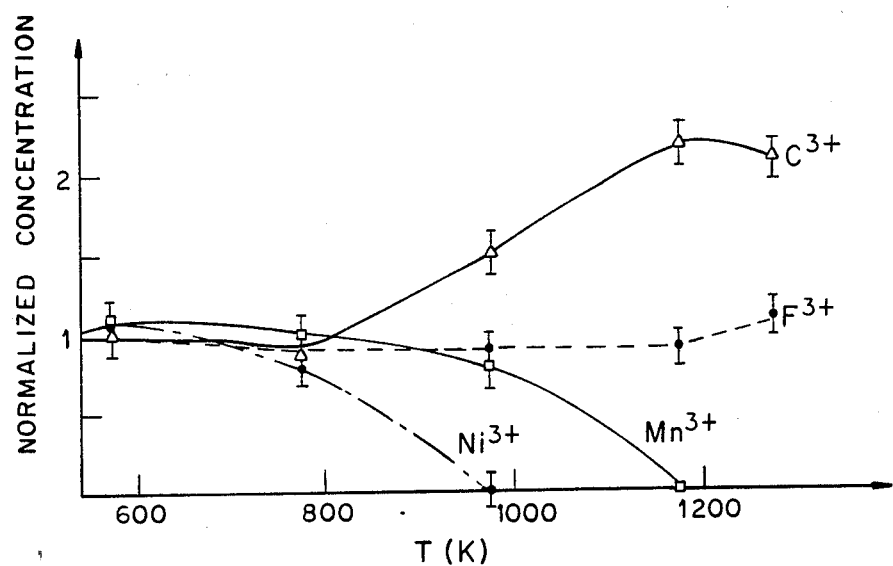
FIG. 3 is a graph of the normalized concentrations of paramagnetic impurities measured by electron paramagnetic resonance (EPR) as a function of annealing temperature in an $H_2$ atmosphere.

A sample crystal was isochronally annealed in H2 atmosphere for 10 minutes each at a series of increasing temperatures. FIG. 3 illustrates the normalized concentrations of various paramagnetic impurities as a function of the annealing temperature. No appreciable change in concentrations occurred below 800° K. At 1000° K., $Ni^{3+}$ vanished. At 1200° K., the cubic $Cr^{3+}$ concentration increased by a factor of two, while $Mn^{4+}$ disappeared. Up to 1200° K., the intensity of the $Fe^{3+}$ signals remained constant. The loss of the $Ni^{3+}$ signal was attended by the loss of the amber color as well as the three absorption bands at 2.6, 3.8 and 5.0 eV (see curve 2b in FIG. 2). At the same time, the 5.3 eV optical absorption band associated with lithium impurities appeared.

Figure 4:
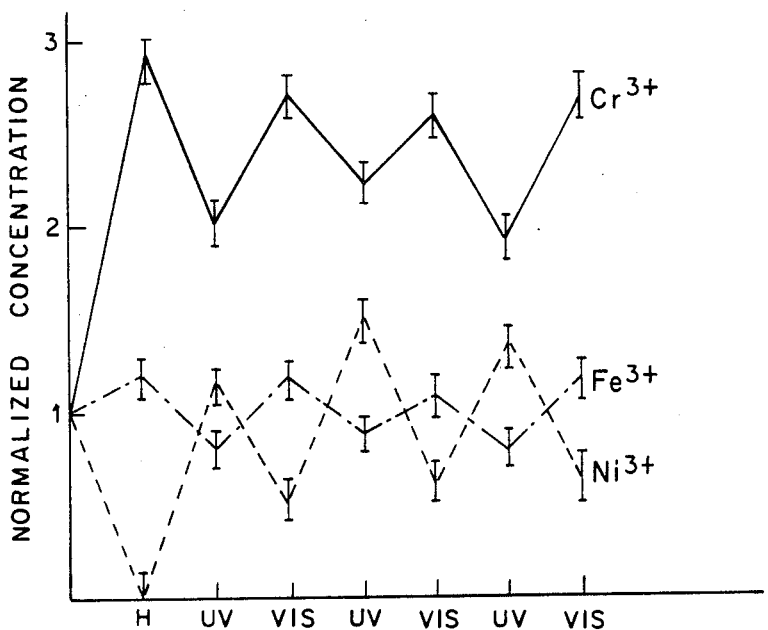
FIG. 4 is a graph of the normalized EPR concentration of $Cr^{3+}$, $Fe^{3+}$ and $Ni^{3+}$ of a thermochemically-reduced invention crystal, followed by sequential illumination with ultraviolet light and visible light.

A thermochemically reduced sample of MgO:Li:Ni exhibits a photochromic effect at room temperature. After reduction in H2 at T >1000° K. (1000° to 2200° K.), the crystal lost the amber color. This color was rejuvenated by exposing the crystal to UV light. A subsequent irradiation with visible light diminished the coloration. Herein the ultraviolet (UV) irradiations were performed with a mineral lamp while visible light irradiations were done with the aid of a 300 watt tungsten lamp in conjunction with a Jarrell-Ash ¼ meter monochromator. The amber color, which is due to the 2.6 and 3.8 eV absorption bands, is correlated with $Ni^{3+}$ ions. In FIG. 4, the effect of thermochemical reduction, followed by a series of alternating ultraviolet light and visible light irradiation, on the normalized concentration of $Ni^{3+}$, $Fe^{3+}$ and $Cr^{3+}$ is shown. The initial reduction resulted in the depletion of $Ni^{3+}$ and an increase of the $Fe^{3+}$ and $Cr_{3+}$ signals. A subsequent ultraviolet light (UV) irradiation rejuvenated the amber color and the $Ni^{3+}$ signal, while the $Fe^{3+}$ and $Cr^{3+}$ decreased. Exposure to visible light reversed this trend. These illuminations can be repeated with the same effect, as shown in FIG. 4.

The photochromic effect can be described by:

$$Ni^{3+} \rightarrow Ni^{2+} + e^+ \rightarrow \quad (1)$$

where $e^+$ denotes a hole. This process is responsible for the loss of the amber coloration. The hole is then captured by either $Fe^{2+}$ or $Cr^{2+}$ ions as given by:

$$\left\{ \begin{array}{l} Fe^{2+} + e^+ \rightarrow Fe^{3+} \\ Cr^{2+} + e^+ \rightarrow Cr^{3+} \end{array} \right\} \rightarrow (2)$$

The rejuvenation of the color is described by the reverse process. It is apparent that the release of holes occurs from defects associated with the optical absorption band at 5.3 eV, which is due to lithium impurities.

Figure 5:
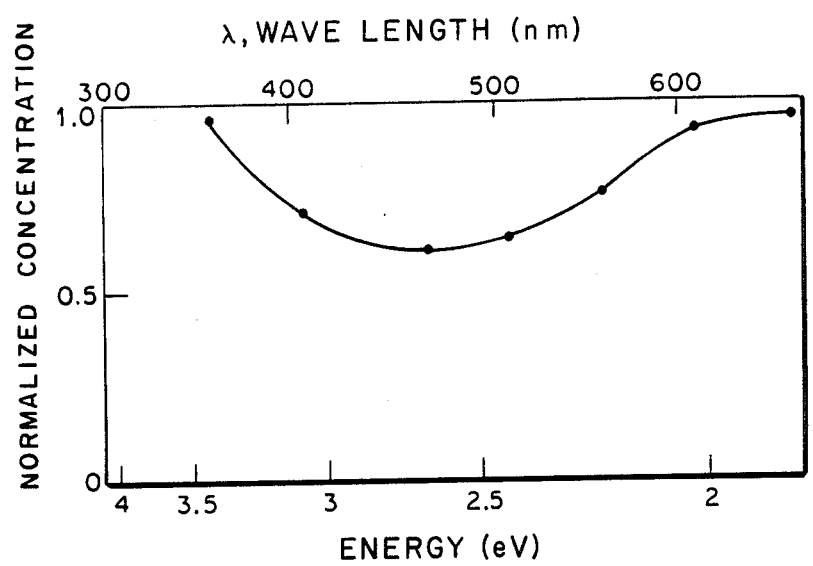
FIG. 5 is a plot of the normalized EPR concentration of $Ni^{3+}$ ions in a thermochemically-reduced invention crystal as a function of optical bleaching with light of different wavelengths.

The effect of exposing a thermochemically reduced crystal to light of various monochromatic wavelengths for one hour is shown in FIG. 5. It can be seen that the most efficient wavelength in bleaching the $Ni^{3+}$ signal is at 2.6 eV (480 nm), confirming that the $Ni^{3+}$ and the 2.6 eV absorption are directly related. Photons of energy of 3.5 eV (350 nm) and above have minimal effect because of the diminished light intensity as the UV region is approached and the fact that ultraviolet light tends to increase the $Ni^{3+}$ signals. It has been established experimentally that the absence of lithium does not produce the effect. MgO crystals containing lithium, but not nickel, or crystals containing nickel, and not lithium, do not exhibit the photochromic effect. The lithium ions provide sites for the trapping of holes from the trivalent nickel ions and enable the reversible charge transfer process to occur. In general, it is expected that two different defect species, impurity or vacancy, can provide the necessary ingredients for the charge transfer mechanism to occur. This should be particularly feasible for aliovalent defects. It is expected that this photochromic effect induced by double defect production is applicable to a wide range of materials, including ionic crystals and semiconductors. The photochromic effect can be induced with two different impurities (as in the invention) or two different vacancies or a combination of the two. It may be necessary in some cases to thermochemically reduce or oxidize the crystals to maximize the photochromic effect.

By way of summary, a reversible photochromic effect is observed in thermochemically-reduced MgO crystals containing both lithium and nickel impurities. Alternate irradiations with UV and visible light result in rejuvenation and bleaching of the amber coloration respectively. Electron paramagnetic resonance and optical absorption techniques can be used to study the charge-transfer mechanisms. The amber coloration, due to the absorption bands at 2.6 and 3.8 eV, has been identified as due to the presence of $Ni^{3+}$ in cubic sites. Divalent iron and chromium impurities serve as traps for holes released from the $Ni^{3+}$ ions. The release of holes likely occurs from defects associated with the optical absorption band at 5.3 eV which is due to the lithium impurity.

The foregoing description of preferred embodiments of the invention has been presented for purposes of illustration and description. It is not intended to be exhaustive or to limit the invention to the precise form disclosed, and obviously many modifications and variations are possible in light of the above teaching. The embodiments were chosen and described in order to best explain the principles of the invention and its practical application to thereby enable one skilled in the art to best utilize the invention in various embodiments and with various modifications as are suited to the particular use contemplated. It is intended that the scope of the invention be defined by the claims appended hereto.

What is claimed is:

1. Photochromic magnesium oxide crystal containing about 0.1 to about 0.01 weight percent, based on the amount of magnesium oxide, of lithium and about 0.05 to about 0.0005 weight percent, based on the amount of magnesium oxide, of nickel.

2. The photochromic magnesium oxide crystal as claimed in claim 1 wherein about 0.04 weight percent, based on the amount of magnesium oxide of lithium and about 0.005 weight percent, based on the amount of magnesium oxide, of nickel are present.

3. Process of changing the photochromic magnesium oxide crystal of claim 1 from a substantially colorless state to an amber color by exposing the photochromic magnesium oxide crystal to ultraviolet light.

4. The process as claimed in claim 3 wherein a beam of ultraviolet light is used.

5. Process of changing the photochromic magnesium oxide crystal of claim 1 from an amber color to a substantially colorless state by exposing the photochromic magnesium oxide crystal to visible light.

6. An optical system which incorporates the photochromic magnesium oxide crystal of claim 1.

7. The optical system as claimed in claim 6 wherein the optical system is an optical filter, a reversible photographic device, a hologram, a system for information storage or a light-operated switching and controlling device.

8. Process for producing a photochromic magnesium oxide crystal containing about 0.1 to about 0.01 weight percent, based on the amount of magnesium oxide, of lithium and about 0.05 to about 0.0005 weight percent, based on the amount of magnesium oxide, of nickel, comprising:
(a) mixing (i) magnesium oxide powder, (ii) about 10 to about 1 weight percent, based on the amount of magnesium oxide powder, of lithium carbonate powder and (iii) about 0.1 to about 0.003 weight percent, based on the amount of magnesium oxide powder, of nickel oxide powder;
(b) growing a crystal from mixture (a) using the arc fusion procedure; and
(c) thermochemically reducing crystal (b) in hydrogen atmosphere at a temperature of 1000° to 2200° K., whereby the photochromic magnesium oxide containing lithium and nickel is obtained.

9. Process as claimed in claim 8 wherein, in step (a), about 5 weight percent, based on the amount of magnesium oxide powder, of lithium carbonate and about 0.01 weight percent, based on the amount of magnesium oxide powder, of nickel oxide powder are used.

10. Photochromic crystal consisting essentially of (i) magnesium oxide, (ii) about 0.1 to about 0.01 weight percent, based on the amount of magnesium oxide, of lithium and about 0.05 to about 0.0005 weight percent, based on the amount of magnesium oxide, of nickel.

11. The photochromic crystal as claimed in claim 10 wherein about 0.04 weight percent, based on the amount of magnesium oxide of lithium and about 0.005 weight percent, based on the amount of magnesium oxide, of nickel are present.

* * * * *